Figure 1:
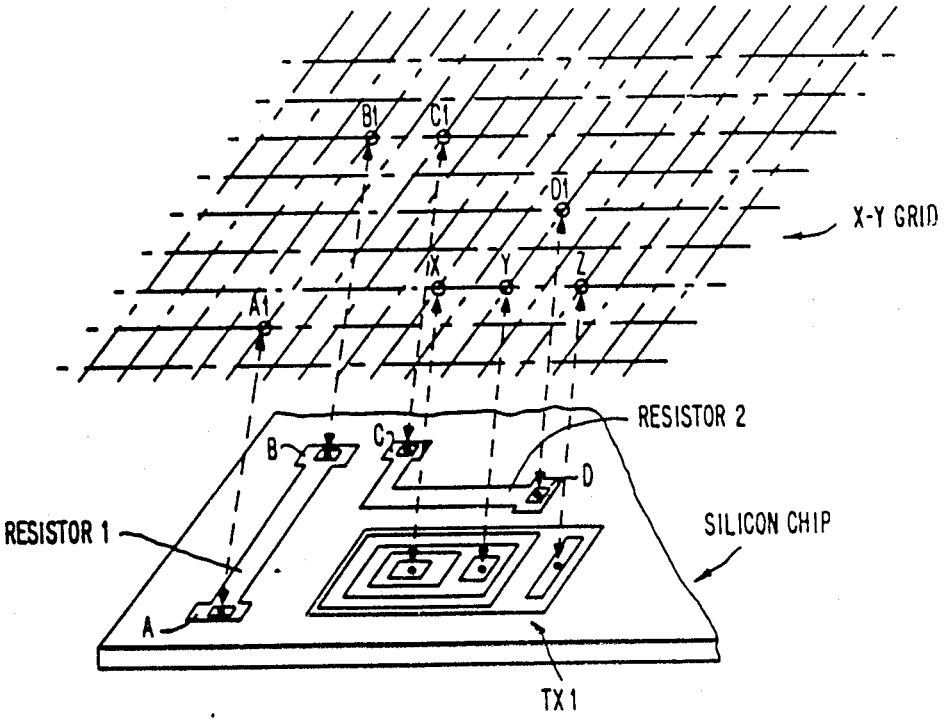
Figure 2:
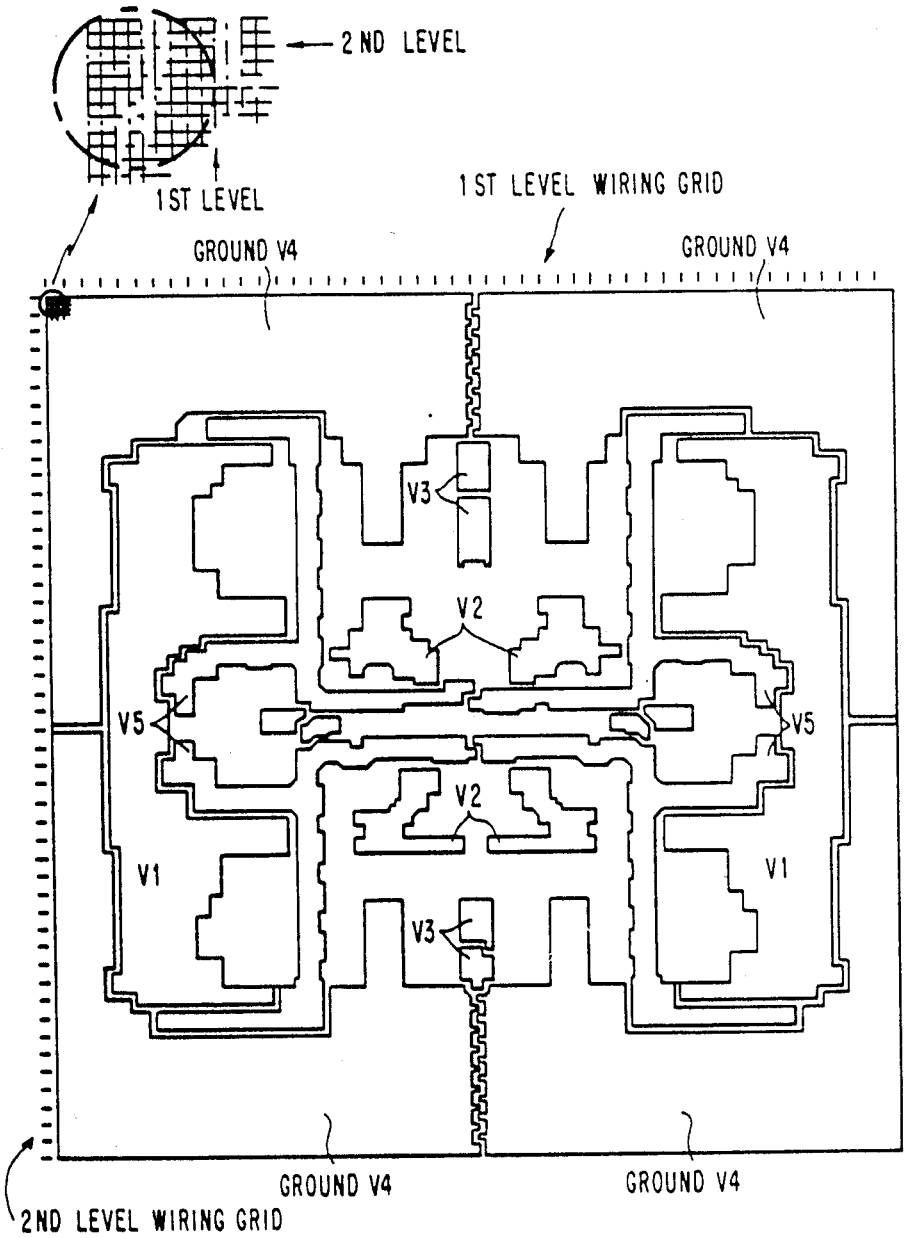
Figure 3:
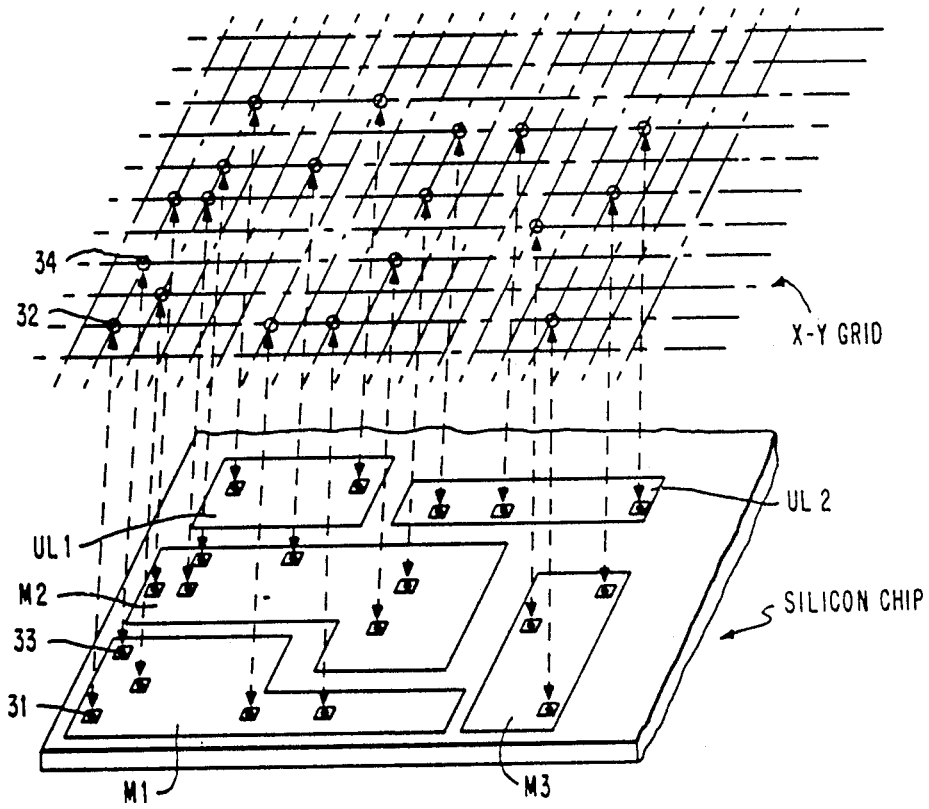
Figure 4:
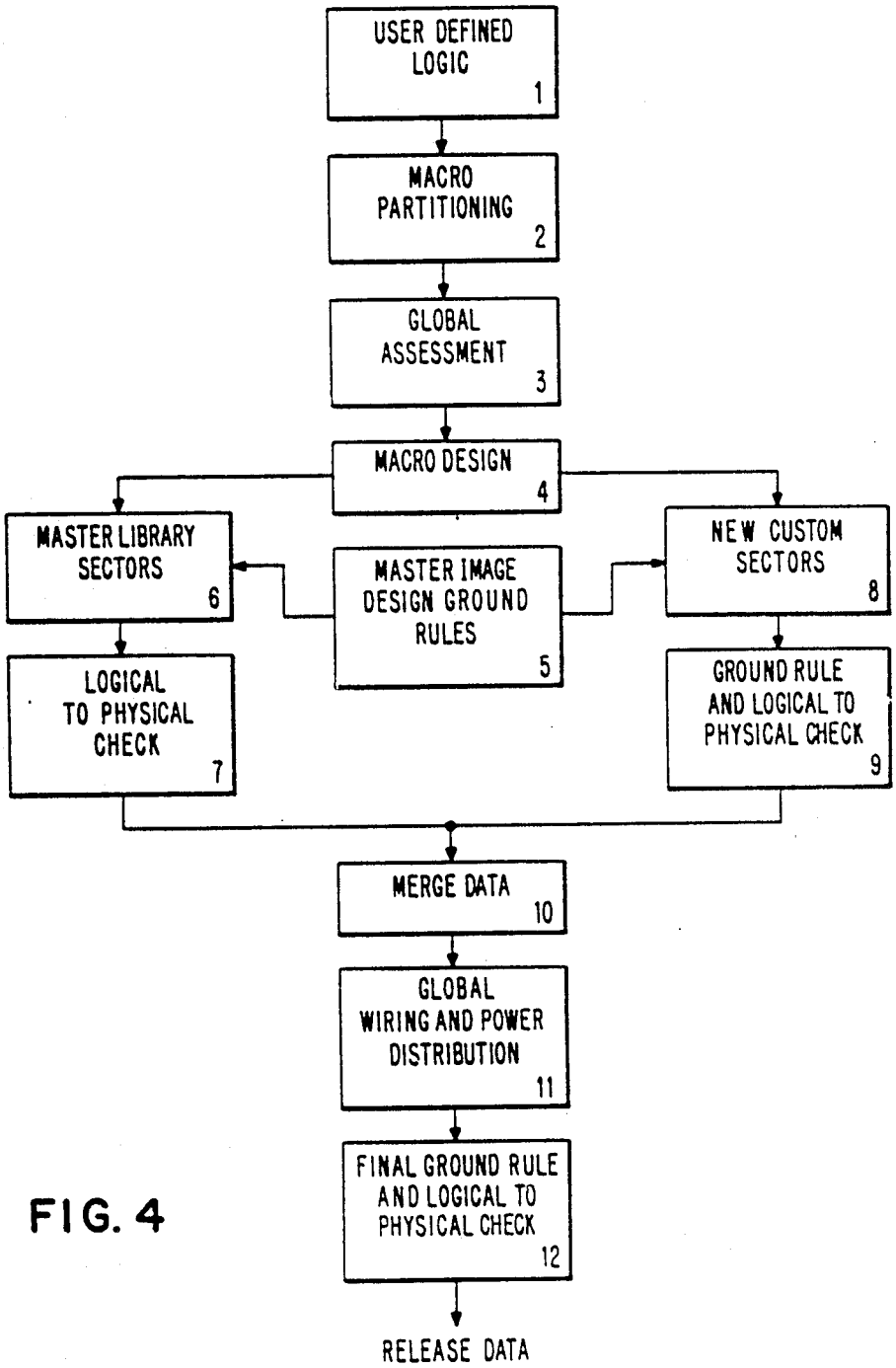
Figure 5:
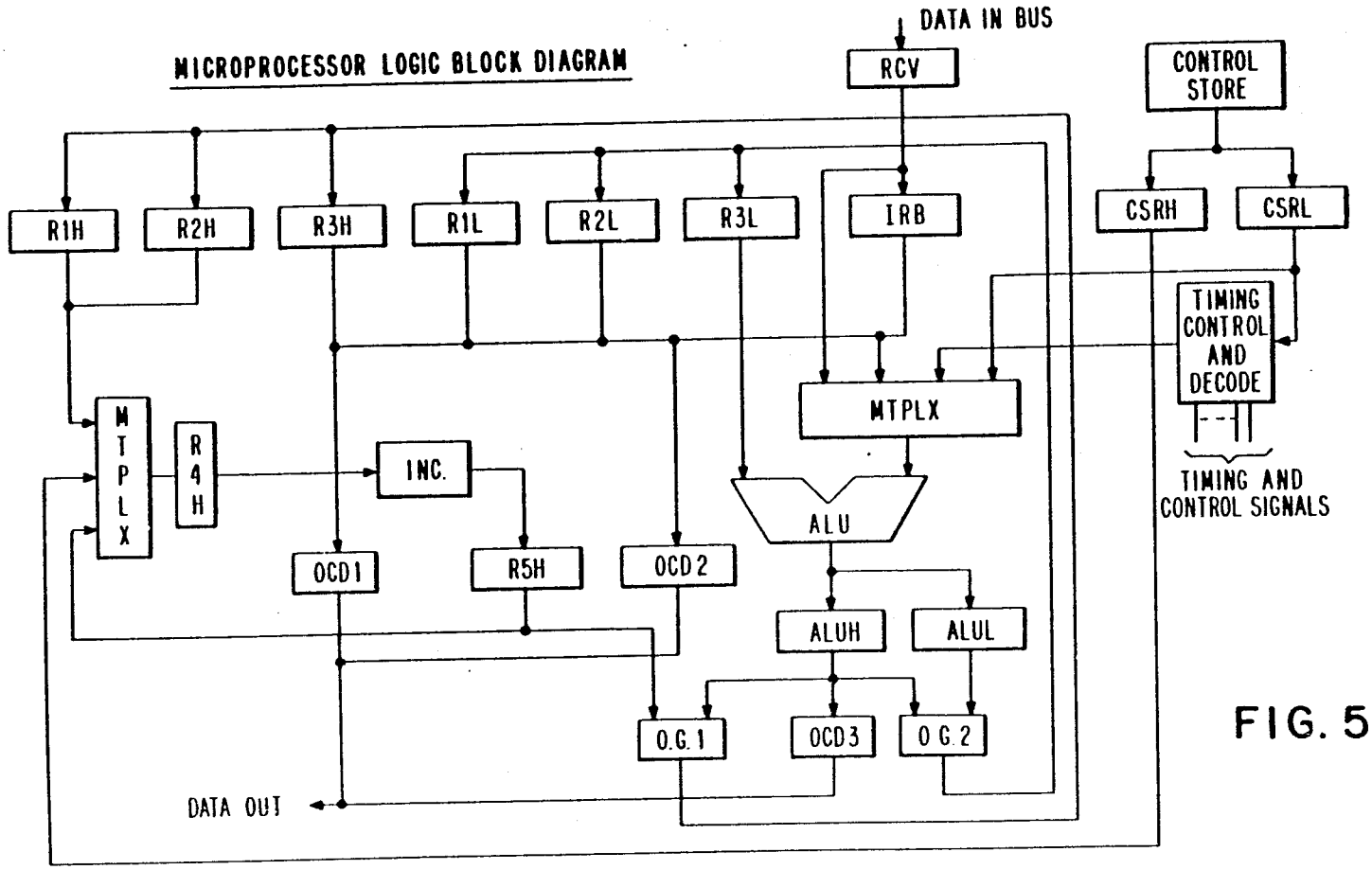
Figure 6:
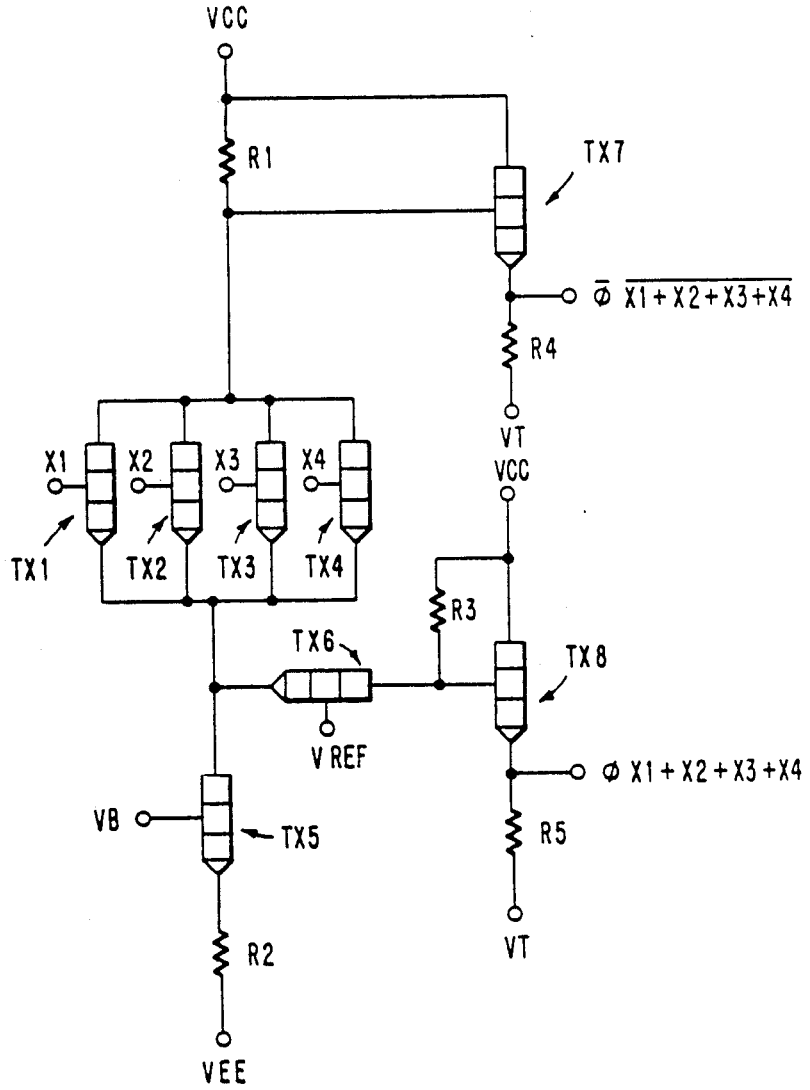
Figure 7:
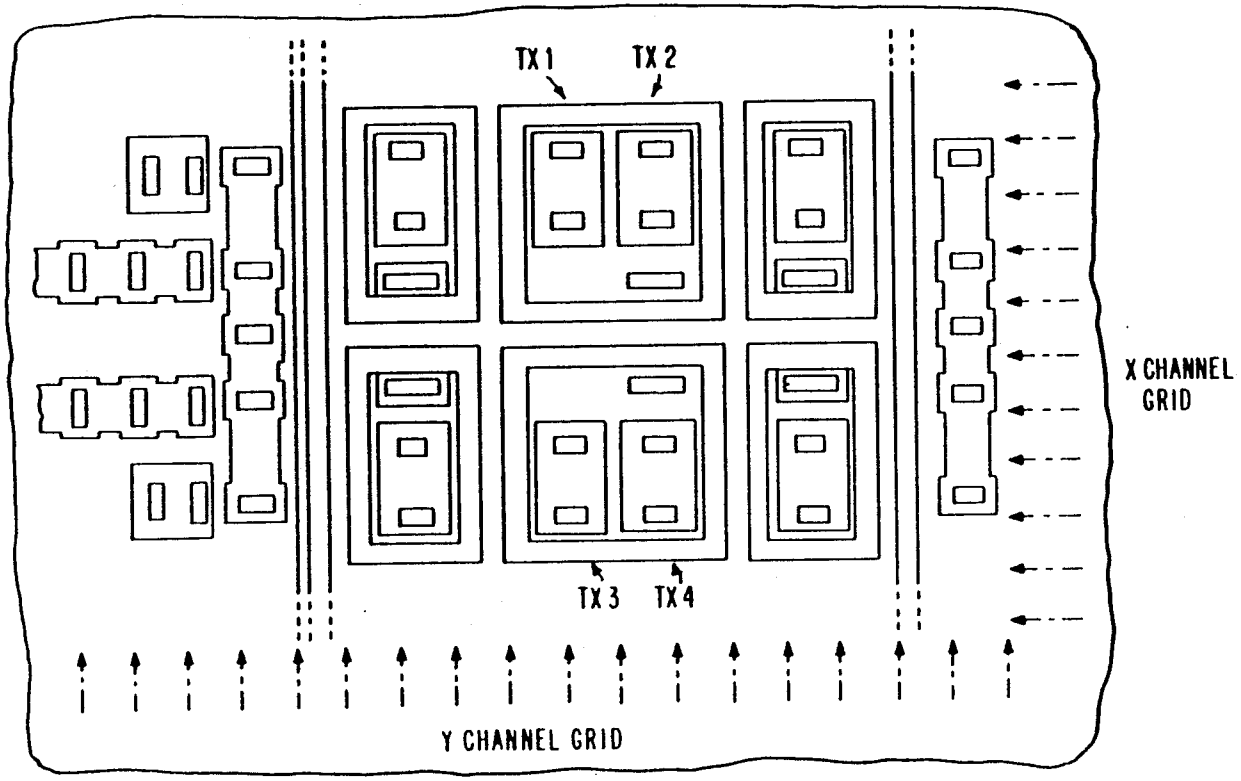
Figure 8:
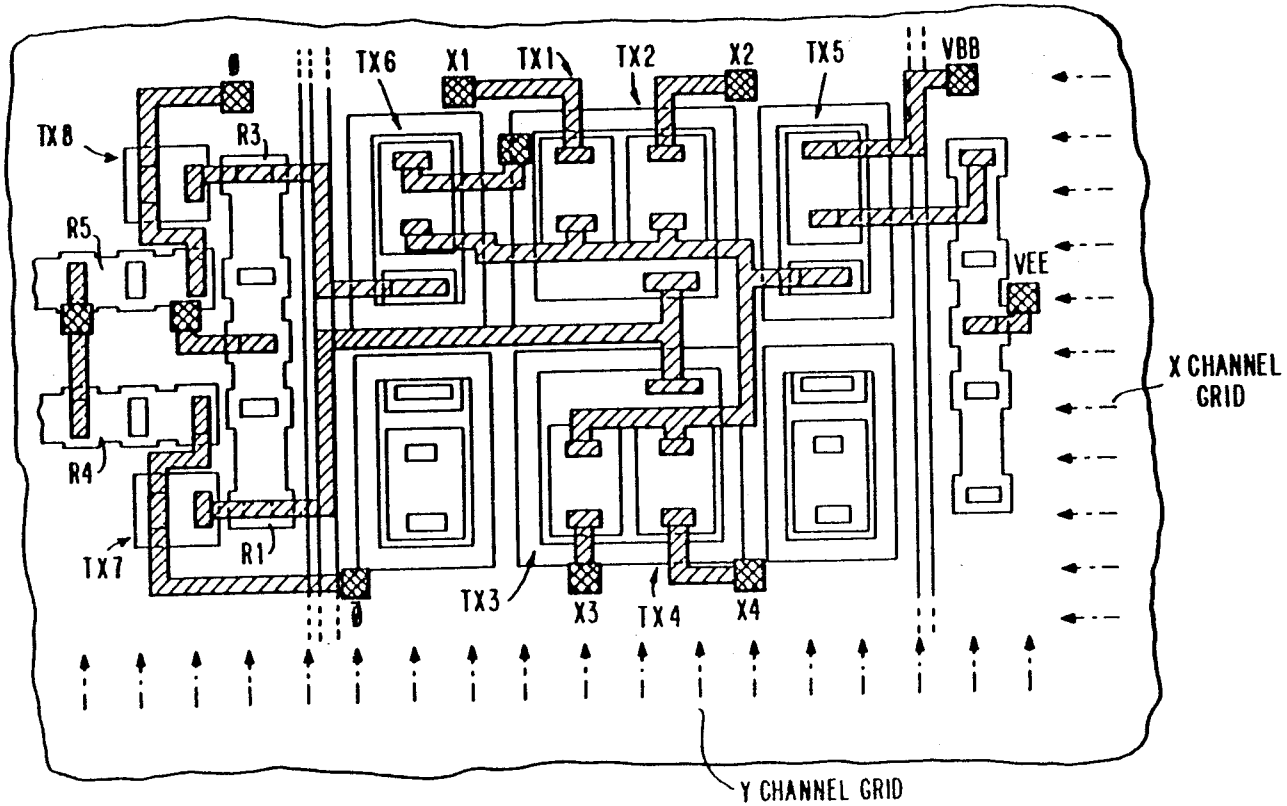
Figures 9, 9A, 9B:
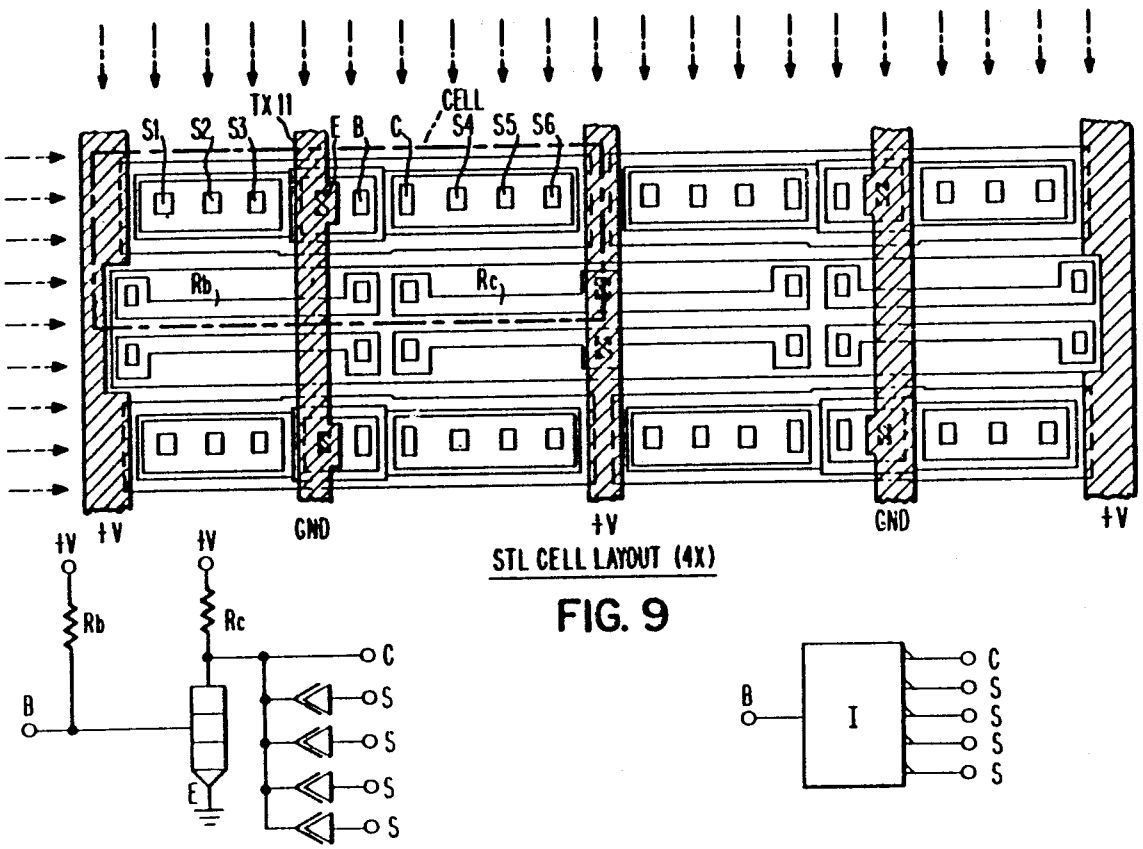
Figure 10:
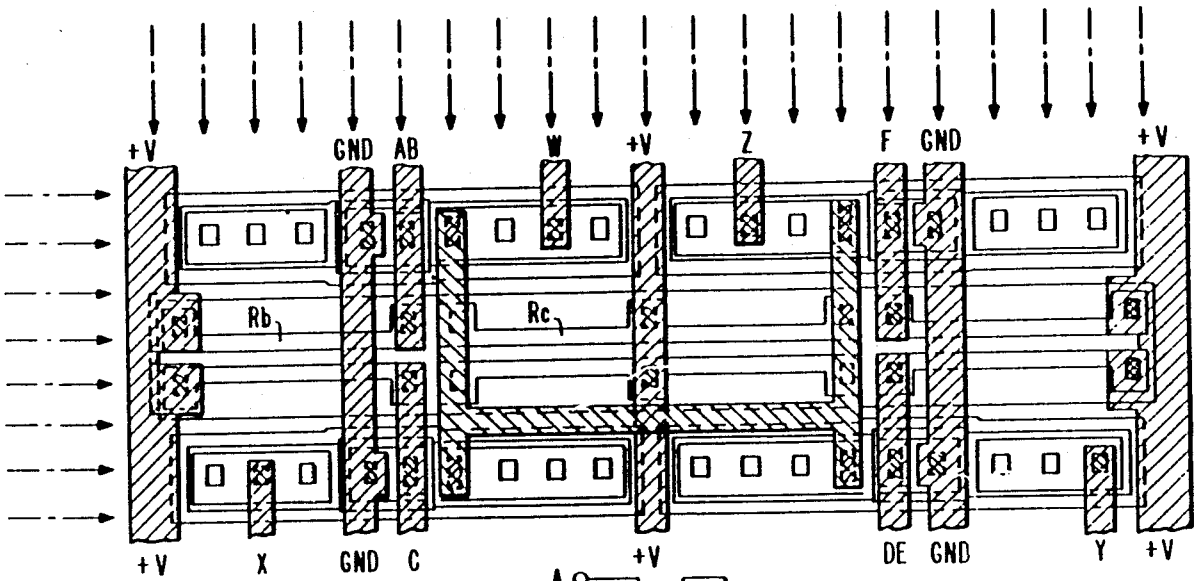
Figure 10A:
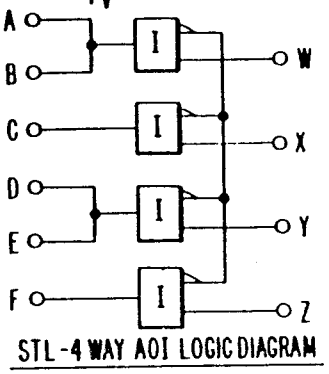
Figure 11:
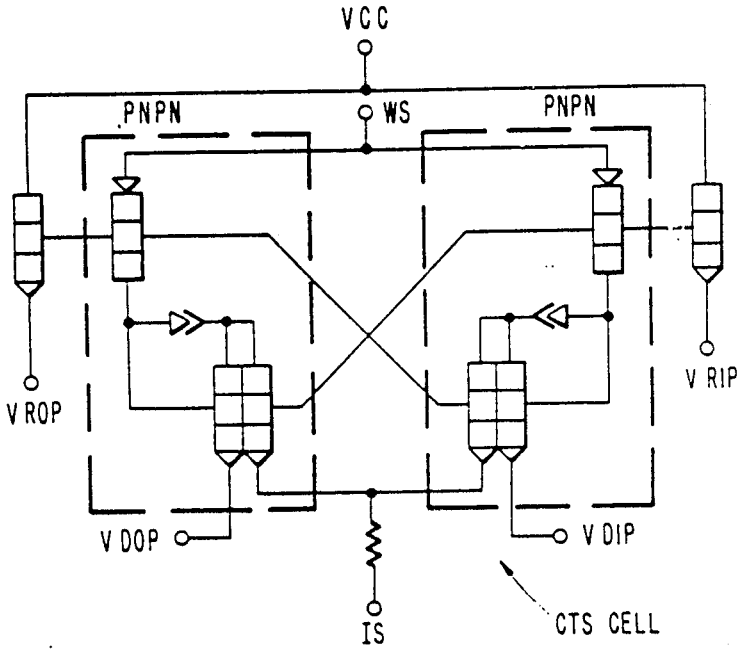
Figure 12:
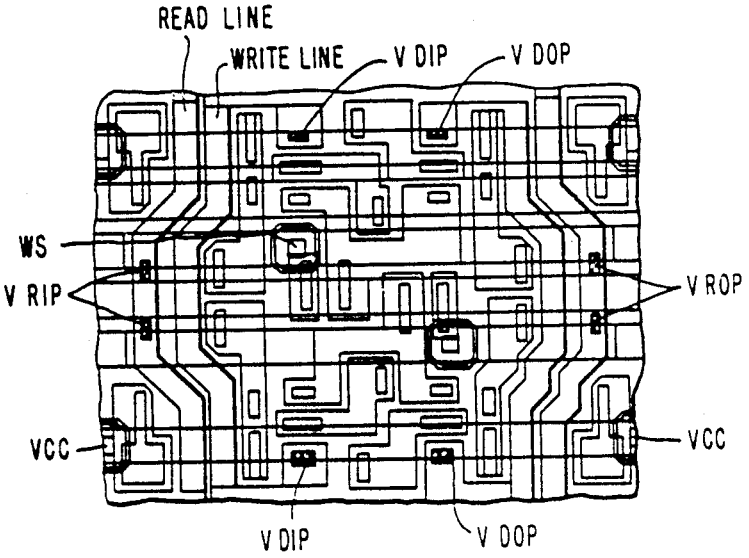
Figure 13:
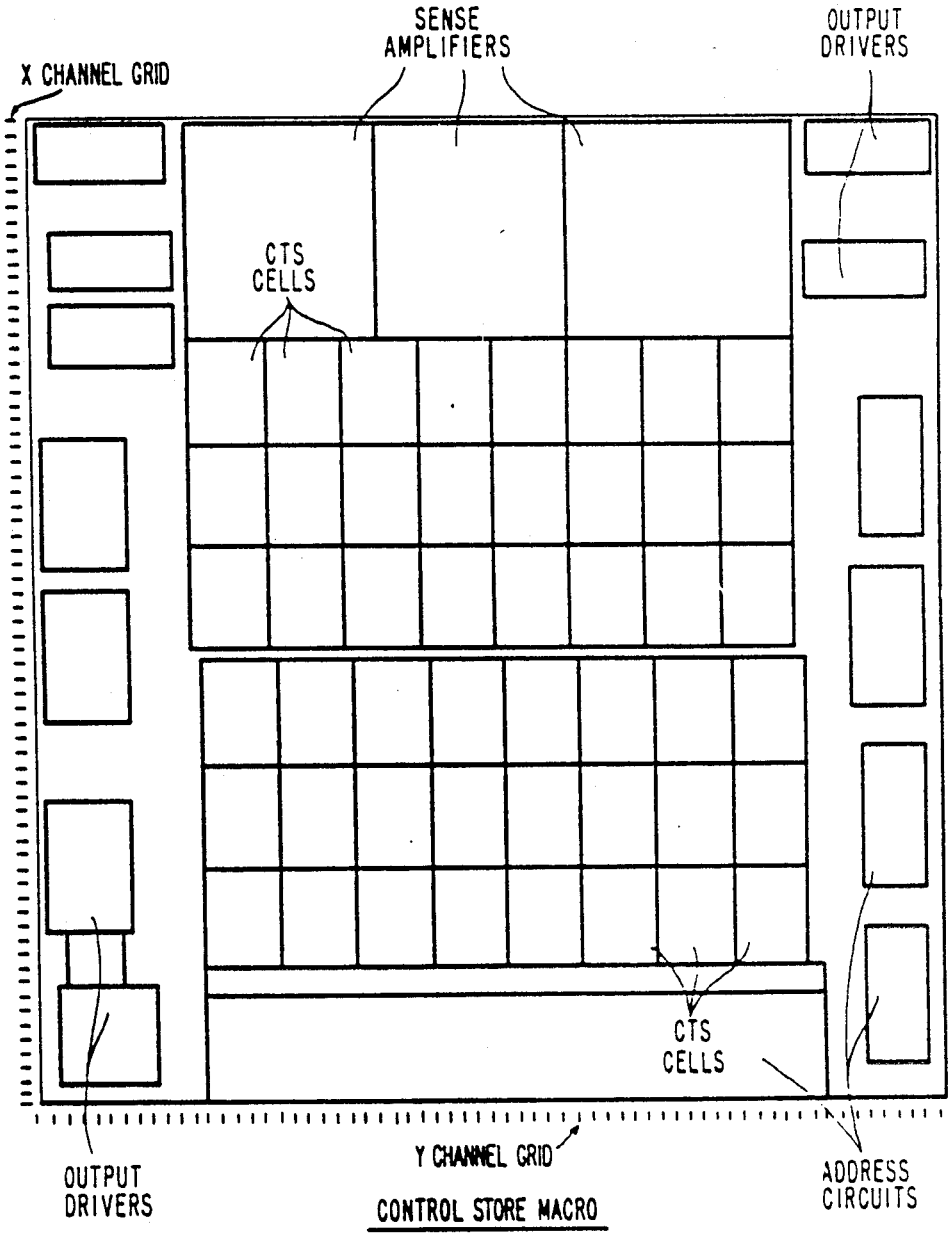
Figure 14:
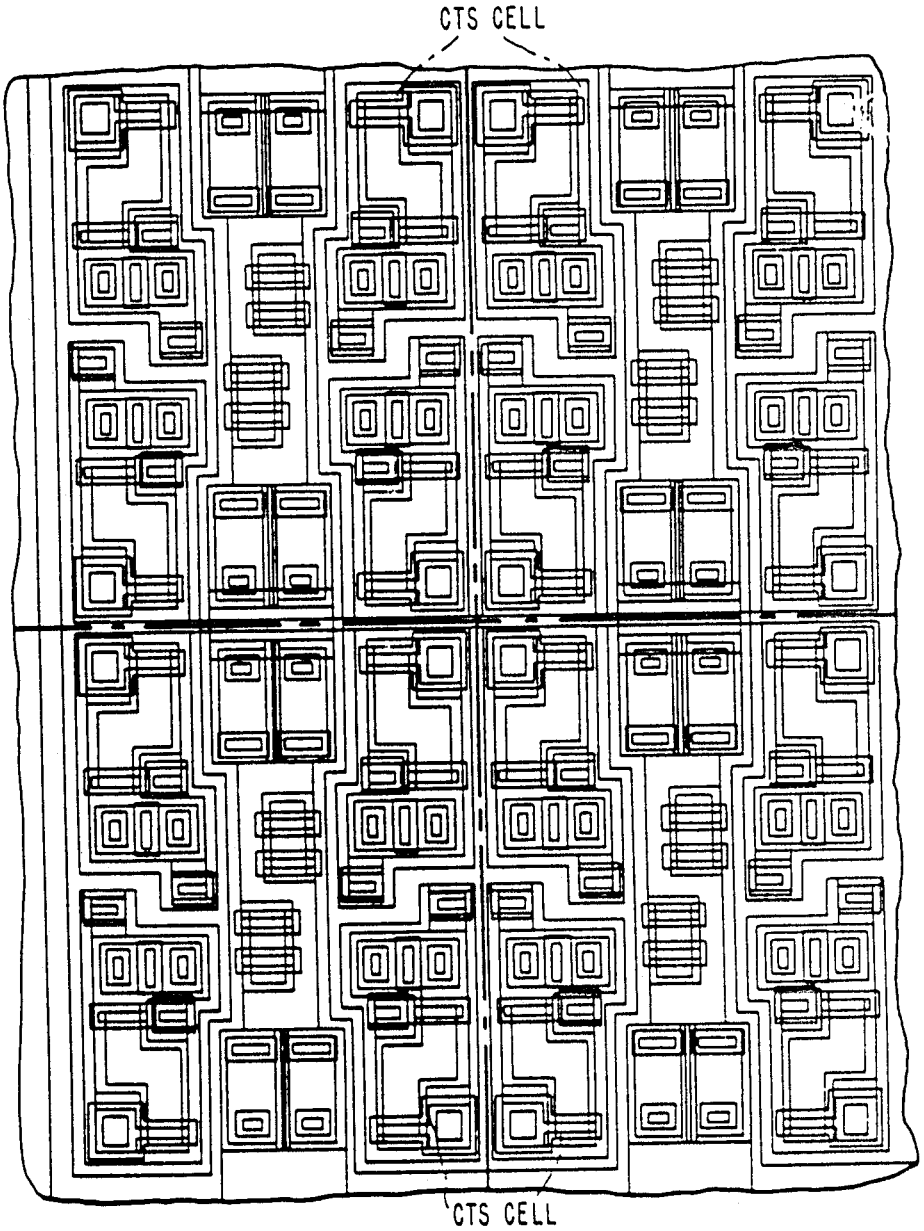
Figure 15:
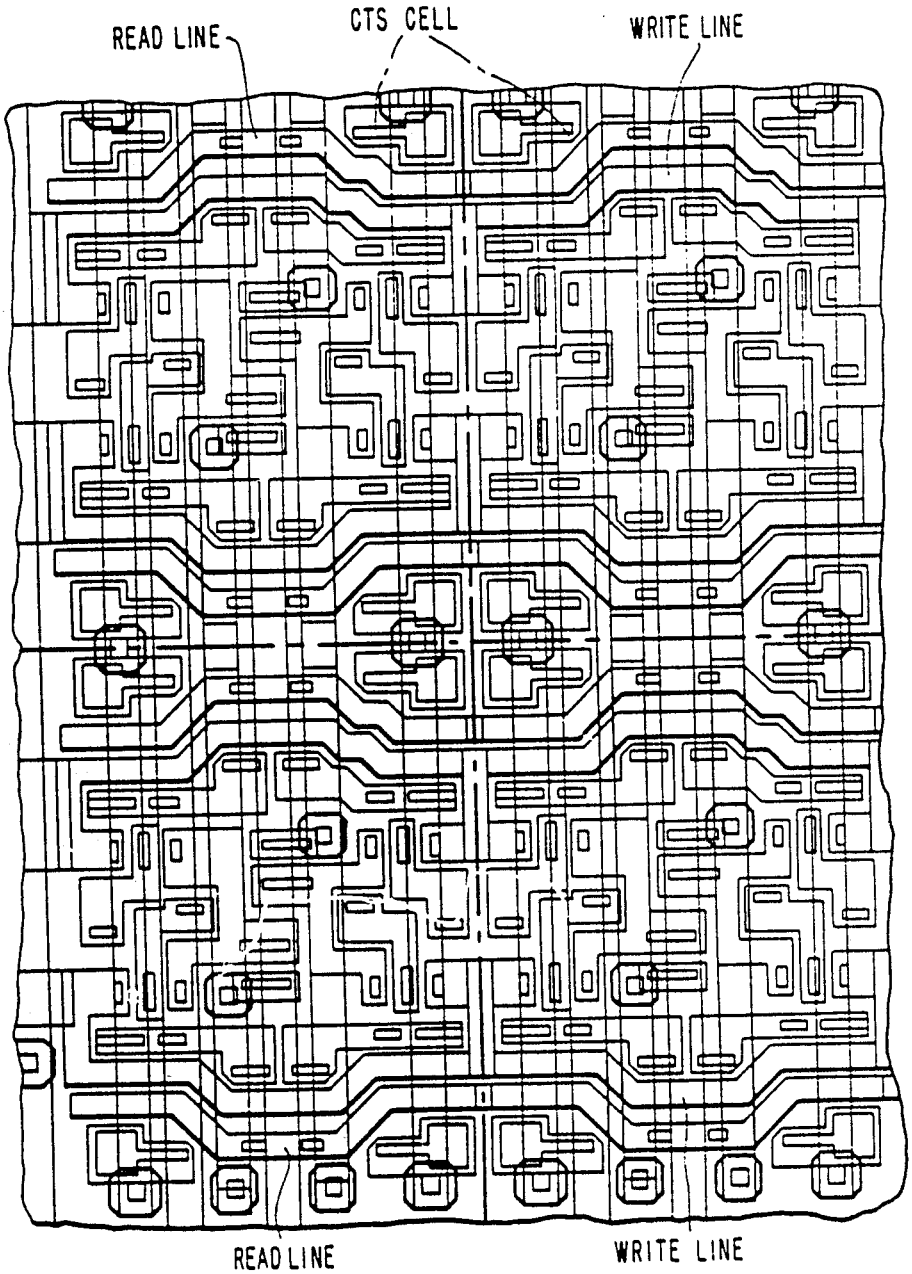
Figure 16:
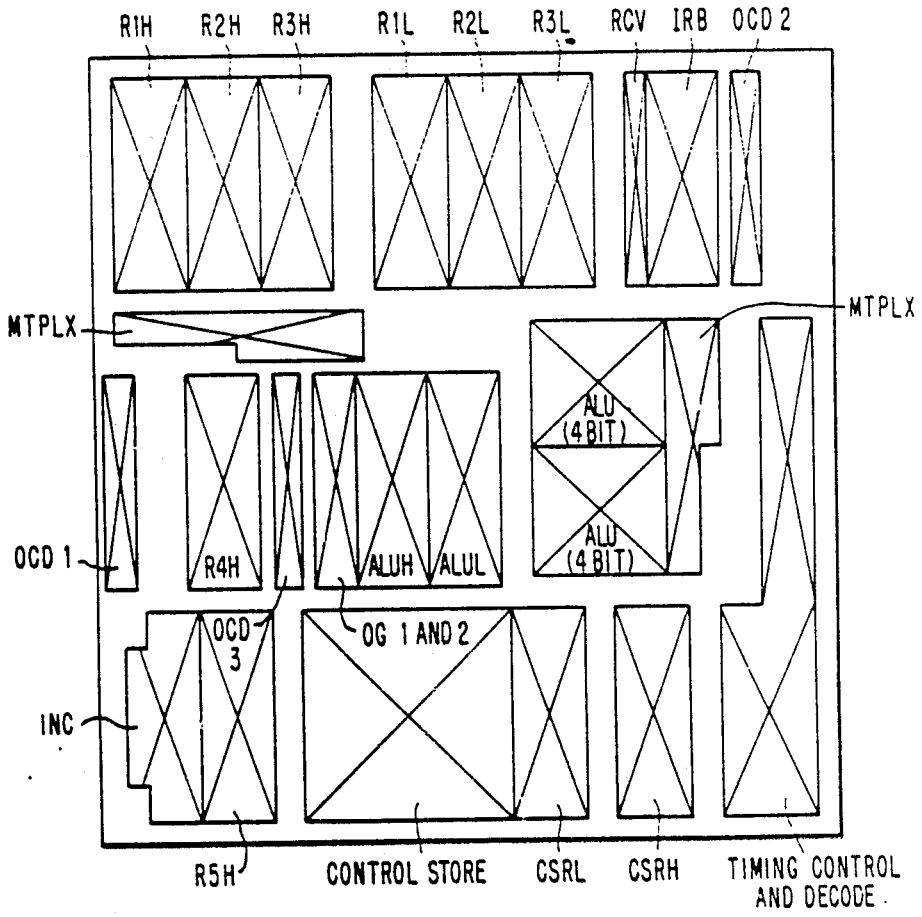

United States Defensive Publication [19] (H) [11] T106,201

Balyoz et al. [43] Mar. 4, 1986

[54] MASTER IMAGE CHIP ORGANIZATION TECHNIQUE OR METHOD

[76] Inventors: John Balyoz, Deerwood Dr., Box 247, R.D. #3, Hopewell Junction, N.Y. 12533; Chi S. Chang, 14 Shale Dr., Wappingers Falls, N.Y. 12590; Barry C. Fox, 26 Miron Dr., Poughkeepsie, N.Y. 12603; John A. Palmieri, 10 Montfort Woods Rd., Wappingers Falls, N.Y. 12590; Majid Ghafghaichi, 352 Vassar Rd., Poughkeepsie, N.Y. 12603; Teh-Sen Jen, 66 Star Mill Rd., Fishkill, N.Y. 12524; Donald B. Mooney, 26 Hagan Dr., Poughkeepsie, N.Y. 12603

[21] Appl. No.: 457,786

[22] Filed: Jan. 13, 1983

Related U.S. Application Data

[60] Continuation of Ser. No. 224,240, Jan. 12, 1981, abandoned, which is a division of Ser. No. 974,576, Dec. 29, 1978, Pat. No. 4,295,149.

[51] Int. Cl.[4] ..... H01L 21/88

[52] U.S. Cl. ..... 29/577 C

[57] ABSTRACT

A method for forming an improved integrated circuit chip structure having a surface from which regions of different conductivity type are arranged in a plurality of electrically isolated macro circuits, each macro circuit including interconnected components, a first X pattern of equally spaced parallel conductors overlying and electrically insulated from said chip structure surface, said first X pattern of conductors being selectively connected to at least certain ones of said plurality of macro circuits, a second Y pattern of equally spaced parallel conductors overlying and electrically insulated from said first pattern of parallel conductors, said second Y pattern of conductors being selectively connected to at least selected certain ones of said first pattern of electrical conductors, said spacing one from another of said first X pattern of conductors being equal to said spacing one from another of said second Y pattern of conductors, said first pattern of conductors being orthogonal of said second pattern of conductors, and each of said connections occurring exclusively at points in space corresponding to X-Y intersections of an X-Y coordinate system, where said X-Y coordinate system geometrically corresponds identically to said X-Y pattern of conductors.

1 Claim, 15 Sheets Drawing,

82 Pages Specification

The file of this unexamined application may be inspected and copies thereof may be purchased (849 O.G. 1221, Apr. 9, 1968).

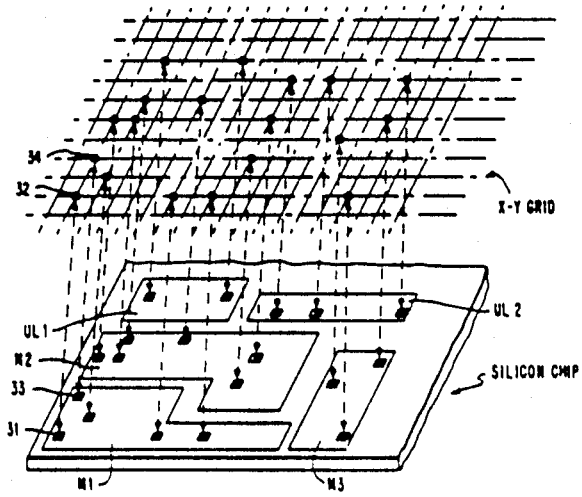

BASIC CURRENT SWITCH EMITTER FOLLOWING CIRCUIT WITH IN-PHASE AND OUT OF-PHASE OUTPUTS (4 INPUTS, 2 OUTPUTS)

STL CELL LAYOUT (4X)

STL LOGIC BLOCK

STL CIRCUIT DIAGRAM

STL - 4 WAY AOI
CELL LAYOUT

STL-4 WAY AOI LOGIC DIAGRAM

MICROPROCESSOR CHIP LAYOUT